(12) United States Patent
Villanella

(10) Patent No.: US 7,491,898 B2
(45) Date of Patent: Feb. 17, 2009

(54) RADIO FREQUENCY SHIELDING ARRANGEMENT

(76) Inventor: Daniel Villanella, 5330 N. 36th West Ave., Skiatook, OK (US) 74070

( * ) Notice: Subject to any disclaimer, the term of this patent is extended or adjusted under 35 U.S.C. 154(b) by 90 days.

(21) Appl. No.: 11/649,092

(22) Filed: Jan. 2, 2007

(65) Prior Publication Data

US 2007/0151760 A1    Jul. 5, 2007

Related U.S. Application Data

(60) Provisional application No. 60/755,256, filed on Dec. 30, 2005.

(51) Int. Cl.
*H01R 4/48* (2006.01)
*H05K 9/00* (2006.01)

(52) U.S. Cl. .................. 174/368; 174/367; 174/382

(58) Field of Classification Search .......... 174/377, 174/367, 368, 370, 382; 361/816, 818, 800; 49/484.1
See application file for complete search history.

(56) References Cited

U.S. PATENT DOCUMENTS 4,064,519 A  * 12/1977  Kee ........................ 396/190

| 4,370,831 | A |  | 2/1983 | Hamilton |
| 4,746,765 | A |  | 5/1988 | Mallott |
| 4,786,758 | A |  | 11/1988 | Zielinski |
| 4,794,206 | A |  | 12/1988 | Weinstein |
| 5,045,636 | A |  | 9/1991 | Johnasen et al. |
| 5,581,048 | A | * | 12/1996 | Shores ........................ 174/356 |
| 6,696,639 | B1 | * | 2/2004 | Nurmi ........................ 174/363 |
| 6,914,184 | B1 | * | 7/2005 | Lahita ........................ 174/374 |

* cited by examiner

*Primary Examiner*—Hung V Ngo
(74) *Attorney, Agent, or Firm*—James Ray & Associates

(57) ABSTRACT

An arrangement for shielding a gap between a pair of adjacently disposed electrically conductive structural members in a radio frequency shielded enclosure against leakage of radio frequency. The shielding arrangement includes a first compressible shielding member and a first retaining member for positioning the first shielding member adjacent an edge portion of one of such pair of structural members. There is a second compressible shielding member and a second retaining member for positioning the second shielding member adjacent an edge of opposed one of such pair of structural members, whereby each of the first and the second shielding members is compressed by an opposed one of the first and the second retaining means for shielding such gap against the leakage of radio frequency. One of such pair of structural members may be a personnel access door.

12 Claims, 1 Drawing Sheet

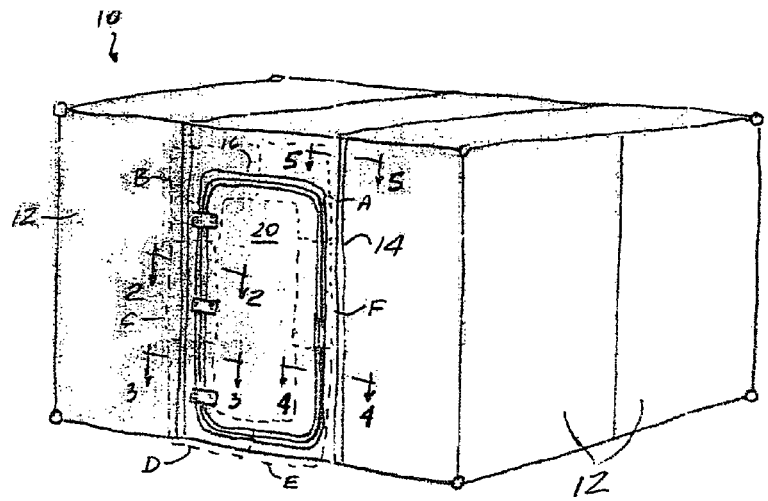
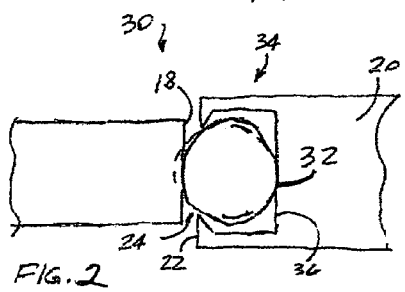
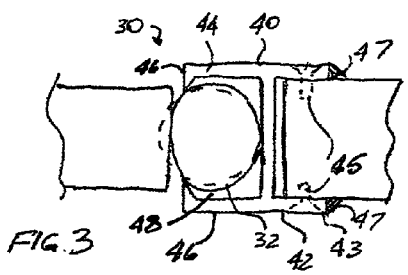
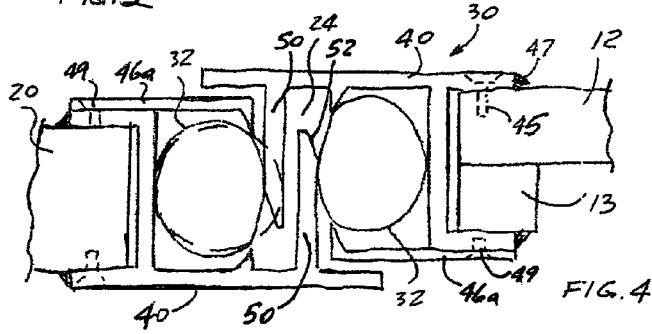
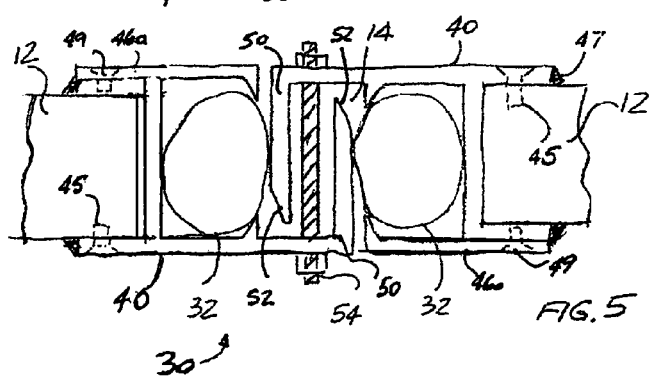
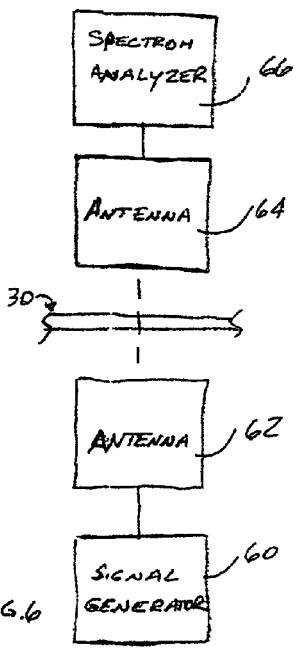

RADIO FREQUENCY SHIELDING ARRANGEMENT

CROSS-REFERENCE TO RELATED APPLICATIONS

This application is related to and claims priority from U.S. Provisional Patent Application Ser. No. 60/755,256 filed Dec. 30, 2005.

FIELD OF THE INVENTION

The present invention relates, in general, to radio frequency (RF) shielding and, more particularly, this invention relates to a shielding arrangement for shielding a gap between a pair of adjacently disposed electrically conductive structural members in a radio frequency shielded enclosure against leakage of radio frequency.

BACKGROUND OF THE INVENTION

As is generally well known, there is a need in the art of radio frequency shielded enclosures or rooms to shield a gap between a pair of adjacently disposed electrically conductive structural members in order to prevent radio frequency leakage through the gap. The gap may be formed between a door edge and an opposed door frame edge or may be formed between opposed edges of the adjacent wall panels.

Prior to the present invention, attempts have been made to provide shielding arrangements for shielding such gap. U.S. Pat. No. 4,786,758 issued to Zielinski discloses a shielding arrangement employing a finger assembly which is mounted to the door and which includes numerous fingers each having a contact portion engageable with the door frame.

U.S. Pat. No. 4,746,765 issued to Mallott and U.S. Pat. No. 4,370,831 issued to Hamilton disclose a shielding arrangement formed from flexible metal plates in combination with a bladder seal.

However, prior art shielding arrangements failed to adequately prevent radio frequency leakage and require greater than desirable maintenance effort.

SUMMARY OF THE INVENTION

According to one embodiment, the invention provides an arrangement for shielding a gap between a pair of adjacently disposed electrically conductive structural members in a radio frequency shielded enclosure against leakage of radio frequency. The arrangement includes a compressible shielding member which is formed by spirally winding an electrically conductive material. A retaining means is provided for retaining the shielding member adjacent an edge of one of such pair of structural members, whereby an opposed one of such pair structural members compresses the shielding member for shielding such gap against the leakage of radio frequency.

According to another embodiment of the invention, there is provided an arrangement for shielding a gap between a pair of adjacently disposed electrically conductive structural members in a radio frequency shielded enclosure against leakage of radio frequency. The shielding arrangement includes a first compressible shielding member and a first retaining member for positioning the first shielding member adjacent an edge portion of one of such pair of structural members. There is a second compressible shielding member and a second retaining member for positioning the second shielding member adjacent an edge of an opposed one of such pair of structural members, whereby each of the first and the second shielding members is compressed by an opposed one of the first and the second retaining means for shielding such gap against the leakage of radio frequency.

OBJECTS OF THE INVENTION

It is, therefore, one of the primary objects of the present invention to provide a radio frequency shielding arrangement.

Another object of the present invention is to provide a radio frequency shielding arrangement which substantially eliminates radio frequency leakage through the gap formed between a pair of adjacently disposed electrically conductive structural members.

Yet another object of the present invention is to provide a radio frequency shielding arrangement which is economical to manufacture.

A further object of the present invention is to provide a radio frequency shielding arrangement which is simple to install.

Yet a further object of the present invention is to provide a radio frequency shielding arrangement which can be employed for shielding a gap between opposed edges of the door and the door frame.

An additional object of the present invention is to provide a radio frequency shielding arrangement which employs a pair of compressible and conductive shielding members.

In addition to the several objects and advantages of the present invention which have been described with some degree of specificity above, various other objects and advantages of the invention will become more readily apparent to those persons who are skilled in the relevant art, particularly, when such description is taken in conjunction with the attached drawing Figures and with the appended claims.

BRIEF DESCRIPTION OF THE DRAWINGS

FIG. 1 is a perspective view of a radio frequency shielded enclosure employing a shielding arrangement of the present invention;

FIG. 2 is a cross-sectional view of the shielding arrangement taken along the lines 2-2 of FIG. 1, which is constructed according to one embodiment of the present invention;

FIG. 3 is a cross-sectional view of the shielding arrangement taken along the lines 3-3 of FIG. 1, which is constructed according to another embodiment of the present invention;

FIG. 4 is a cross-sectional view of the shielding arrangement taken along the lines 4-4 of FIG. 1, which is constructed according to a presently preferred embodiment of the invention;

FIG. 5 is a cross-sectional view of the shielding arrangement taken along the lines 5-5 of FIG. 1, which is constructed according to yet another embodiment of the present invention for joining a pair of panels; and FIG. 6 is a block diagram of a testing set-up employed for testing an effectiveness of the shielding arrangement of FIG. 4.

BRIEF DESCRIPTION OF THE VARIOUS EMBODIMENTS OF THE INVENTION

Prior to proceeding to the more detailed description of the present invention, it should be noted that, for the sake of clarity and understanding, identical components which have identical functions have been identified with identical reference numerals throughout the several views illustrated in the drawing figures.

Reference is now made, to FIG. 1, wherein there is shown a radio frequency shielded enclosure, generally designated 10. As it is well known in the art, the enclosure 10 includes a plurality of electrically conductive structural panel members 12 with each pair of adjacently disposed panels forming a seam 14. The enclosure 10 also includes at least one personnel access door 20 which is also electrically conductive and which selectively covers and uncovers an aperture 16 generally formed in one of the side wall panels 12. A gap 24, best shown in FIGS. 2-3, is formed between the peripheral edge 22 of the door 20 and the peripheral edge 18 of the aperture 16.

Now in particular reference to FIG. 2, therein is shown an arrangement, generally designated 30, for shielding such gap 24 against leakage of radio frequency when the door 20 is positioned to cover the aperture 16. The arrangement 30 includes a compressible shielding member 32 which is formed by spirally winding an electrically conductive material.

According to a presently preferred embodiment of the invention, such conductive material of the shielding member 32 is a spring temper beryllium copper which provides improved spring memory and compression set resistance. The presently preferred shielding member 32 is of a Spira-Shield type manufactured by Spira Manufacturing Corporation of North Hollywood, Calif. The diameter of the shielding member 32 is selected based on the shielding requirements and may also be based on the thickness of the door 20.

A layer of material having a composition of tin and lead may be further applied to each surface and edge of the shielding member 32 to improve electrical conductivity and shielding properties. Advantageously, when the layer of tin and lead material is applied to each edge, the shielding member 32 is protected against corrosion when used with an aluminum retaining member and further when used in a humid or salt fog environment.

Arrangement 30 further includes a retaining means, generally designated 34, for retaining the shielding member 32 adjacent an edge 22 of the door 20. Such retaining means 34 includes an edge groove 36 having each of a predetermined shape and a predetermined size. The presently preferred shape of the groove 36 is a dovetail shape to enable a portion of the shielding member 32 to extend beyond the edge 22 of the door 20.

In operation, the peripheral edge 18 of the aperture 16 compresses the shielding member 32 positioned around the peripheral edge 22 of the door 20 for shielding such gap 24 against the leakage of radio frequency when the door 20 is in a position for covering the aperture 16. The shielding member 32, which is generally round in an uncompressed position, becomes generally oval when compressed. It will be apparent to those skilled in the art that the groove 34 may be alternatively formed within the peripheral edge 18 of the aperture 16, whereby the shielding member 32 is compressed by the peripheral edge 22 of the door 20.

Now in reference to FIG. 3, the retaining means 34 preferably includes a rigid member 40 having a first portion 42 attached to the door 20 and a second portion 44 adapted for receiving the shielding member 32. For ease of installation, the first portion 42 has a generally U-shape cross-section sized to overlap the door 20. A plurality of fasteners 45 are provided for fastening each leg 43 of the first portion 42 to the door 20. Alternatively to or in combination with the plurality of fasteners 45, the present invention contemplates to soldering, with a solder 47, each leg 43 of the first portion 42 to the outer surface of the door 20.

The second portion 44 includes a pair of oppositely positioned legs 46 which form a groove 48 having a presently preferred dovetail shape. Both legs 46 are formed integral with the first portion 42 which enable simple and economical manufacturing of such rigid member 40 from an aluminum extrusion. Alternatively, one of the legs 46 may be formed as a separate member, referenced as 46a for the sake of clarity, and attached to the rigid member 40 with a plurality of fasteners 49 for ease of installation and removal of the shielding member 32.

It will be apparent to those skilled in the art that the rigid member 40 may be adapted for attachment to the panel 12. This is particularly advantageous when the thickness of the panel 12 and, more particularly, the thickness of the edge 18 is smaller than the thickness of the door 20 and is not adequately suited to compress the shielding member 32. A spacer block 13 may be employed to artificially increase the thickness of the panel 12 in order to utilize the same rigid member 40 as is suitable for installation on the door 20.

It has been found that for substantially eliminating leakage of radio frequency through the gap 24 it is necessary to employ a pair of shielding members 32 as best shown in FIG. 4. Accordingly, the shielding arrangement 30 employs a pair of rigid members 40. The first rigid member 40 positions the first shielding member 32 adjacent the edge 22 of the door 20 while the second rigid member 40 positions the second shielding member 32 adjacent the edge 18 of the aperture 16.

Furthermore, each rigid member 40 is preferably adapted with a force applying portion 50 for compressing the opposed shielding member 32 when the door 20 is positioned for covering the aperture 16. The force applying portion 50 is fitted with a knife shaped edge 52 to improve initial contact with the shielding member 32.

Table 1 contains the test results of the arrangement 30 constructed according to the embodiment of FIG. 4 and tested according to methodology NSA 94-106 which is derived from MIL-STD-285. The basic test set-up is shown in FIG. 6 and test point zones are shown in FIG. 1. Briefly, the test set-up includes a signal generator 60, a signal sending antenna 62, a signal receiving antenna 64 and a signal analyzer 66. The signal receiving antenna 64 and the signal analyzer 66 are positioned within the enclosure 10.

As is generally well known, RF leakage (attenuation) through the gap 24, for the purposes of these measurements is the ratio, expressed in decibels (dB), of the received signal when a receiving antenna is illuminated by electromagnetic radiation in the test calibration configuration (no shield present) to a received signal through the electromagnetic barrier formed by the arrangement 30 in the test measurement configuration.

TABLE 1

| FREQUENCY | *FIELD PROP. | TEST POINT ZONES (see diag.) | DYNAMIC RANGE (db) | MAX. MEASURED LEVEL (db) | MIN. SHIELDING ATTEN. (db) | ATTEN. IDEAL(db) | TEST ZONE NOTE |
|---|---|---|---|---|---|---|---|
| 1 GHz | PW | A | 130 | 0 | 130 | 100 | TOP RIGHT |
|  |  | B | 130 | 0 | 130 | 100 | TOP LEFT |
|  |  | C | 130 | 0 | 130 | 100 | MID LEFT |
|  |  | D | 130 | 0 | 130 | 100 | LOWER LEFT |
|  |  | E | 130 | 0 | 130 | 100 | LOWER RIGHT |
|  |  | F | 130 | 0 | 130 | 100 | MID RIGHT |

TABLE 1-continued

| FREQUENCY | *FIELD PROP. | TEST POINT ZONES (see diag.) | DYNAMIC RANGE (db) | MAX. MEASURED LEVEL (db) | MIN. SHIELDING ATTEN. (db) | ATTEN. IDEAL(db) | TEST ZONE NOTE |
|---|---|---|---|---|---|---|---|
| 10 GHz | MW | A | 125 | 0 | 125 | 100 | TOP RIGHT |
|  |  | B | 125 | 0 | 125 | 100 | TOP LEFT |
|  |  | C | 125 | 0 | 125 | 100 | MID LEFT |
|  |  | D | 125 | 0 | 125 | 100 | LOWER LEFT |
|  |  | E | 125 | 5 | 120 | 100 | LOWER RIGHT |
|  |  | F | 125 | 0 | 125 | 100 | MID RIGHT |

The test was conducted at frequencies of 1 GHz and 10 GHz. The results, as shown in Table 1, were maintained after repetitive cycling of the door 20 over several hundred sequences. The only small measurable signal within the dynamic ranges produced was at a singular lower radius corner only at the 10 GHz measurement.

The arrangement 30 constructed according to the embodiment of FIG. 4 is further advantageous for connecting a pair of panels 12 together and for shielding the seam 14 from leakage of radio frequency. Now in reference to FIG. 5, a pair of rigid members 40 may be simply fastened to each other with a plurality of fastening means 54.

Although the present invention has been shown in terms of the arrangement for shielding a pivotally mounted door 20, it will be apparent to those skilled in the art, that the present invention may be applied to the door 20 mounted for sliding movement.

Furthermore, when a pair of shielding members 32 are employed for shielding the gap 32, such shielding members may be of a gasket type employing a conductive wire mesh which is integrally disposed within an elastomeric compressible seal.

Furthermore, other types of shielding members 32 manufactured by Spira Manufacturing Corporation may be employed in the present invention depending on the specific shielding requirements and manufacturing costs.

Thus, the present invention has been described in such full, clear, concise and exact terms as to enable any person skilled in the art to which it pertains to make and use the same. It will be understood that variations, modifications, equivalents and substitutions for components of the specifically described embodiments of the invention may be made by those skilled in the art without departing from the spirit and scope of the invention as set forth in the appended claims.

I claim:

1. In a radio frequency shielded enclosure, an arrangement for shielding a gap between a pair of adjacently disposed electrically conductive structural members against leakage of radio frequency, said arrangement comprising:
 (a) a first compressible shielding member;
 (b) a first retaining means for positioning said first shielding member adjacent an edge portion of one of the pair of structural members;
 (c) a second compressible shielding member; and
 (d) a second retaining means for positioning said second shielding member adjacent an edge of opposed one of the pair of structural members, whereby each of said first and said second shielding members is compressed by an opposed one of said first and said second retaining means for shielding the gap against the leakage of radio frequency.

2. The apparatus, according to claim 1, wherein each of said first and second retaining means includes a groove formed in the edge of a respective one of the pair of structural members, said grove having each of a predetermined shape and a predetermined size.

3. The apparatus, according to claim 1, wherein each of said first and second retaining means includes a rigid member having a first portion attached to a respective one of the pair of structural members and a second portion thereof adapted for receiving a respective compressible shielding member.

4. The apparatus, according to claim 3, wherein said each of said first and second retaining means further includes a plurality of fasteners for fastening said first portion of said rigid member to the respective one of the pair of structural members.

5. The apparatus, according to claim 3, wherein said each of said first and second retaining means further includes a solder means for soldering said first portion to the respective one of the pair of structural members.

6. The apparatus, according to claim 1, wherein one of the pair of electrically conductive structural members is a door of the enclosure.

7. The apparatus, according to claim 1, wherein each of the pair of electrically conductive structural members is an electrically conductive panel of the enclosure.

8. The apparatus, according to claim 7, wherein said arrangement further includes a fastening means for securing said first retaining means and said second retaining means therebetween.

9. The apparatus, according to claim 1, wherein each of said first retaining means and said second retaining means includes a force applying portion for compressing an opposed one of said first compressible shielding member and said second compressible shielding member.

10. The apparatus, according to claim 1, wherein said force applying portion includes a knife shaped edge.

11. The apparatus, according to claim 1, wherein each of said first compressible shielding member and said second compressible shielding member is formed by spirally winding an electrically conductive material.

12. The apparatus, according to claim 11, wherein said electrically conductive material is a spring temper beryllium copper.

\* \* \* \* \*